(12) United States Patent
Mikhalev

(10) Patent No.: US 8,102,709 B2
(45) Date of Patent: Jan. 24, 2012

(54) TRANSISTOR HAVING PERIPHERAL CHANNEL

(75) Inventor: Vladimir Mikhalev, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 417 days.

(21) Appl. No.: 12/476,681

(22) Filed: Jun. 2, 2009

(65) Prior Publication Data

US 2010/0302848 A1    Dec. 2, 2010

(51) Int. Cl.
*G11C 16/04* (2006.01)

(52) U.S. Cl. ............................... 365/185.05; 365/230.06

(58) Field of Classification Search ............. 365/185.05, 365/230.06
See application file for complete search history.

(56) References Cited

U.S. PATENT DOCUMENTS

| 5,910,925 | A * | 6/1999 | Guterman et al. | ........ 365/230.01 |
| 6,009,017 | A * | 12/1999 | Guo et al. | ................ 365/185.28 |
| 7,050,330 | B2 * | 5/2006 | Forbes | ..................... 365/185.03 |
| 2003/0161192 | A1 * | 8/2003 | Kobayashi et al. | ........... 365/200 |
| 2004/0004863 | A1 * | 1/2004 | Wang | ............................. 365/199 |
| 2004/0233726 | A1 * | 11/2004 | Iwase et al. | ............... 365/185.22 |
| 2004/0257875 | A1 * | 12/2004 | Yaoi et al. | ................. 365/185.18 |
| 2005/0243601 | A1 * | 11/2005 | Harari | ........................ 365/185.3 |
| 2007/0183213 | A1 * | 8/2007 | Kusakabe et al. | ........ 365/185.23 |

FOREIGN PATENT DOCUMENTS

EP      0880183 A2      11/1998

OTHER PUBLICATIONS

SHF products for 10-100G "LDMOS" updated Jun. 17, 2006, 3 pages, Microwave Encyclopedia—www.Microwaves101.com.

* cited by examiner

*Primary Examiner* — Tuan T. Nguyen
(74) *Attorney, Agent, or Firm* — Leffert Jay & Polglaze, P.A.

(57) ABSTRACT

Transistors for use in semiconductor integrated circuit devices including a first source/drain region of the transistor is formed around a perimeter of a channel region, and a second source/drain region formed to extend below the channel region such that the channel region is formed around a perimeter of the source/drain region. Such transistors should facilitate a reduction in edge effect and leakage as the channel of the transistor is not bordering on an isolation region. Additionally, the use of a source/drain region extending through a channel region facilitates high-power, high-voltage operation.

23 Claims, 4 Drawing Sheets

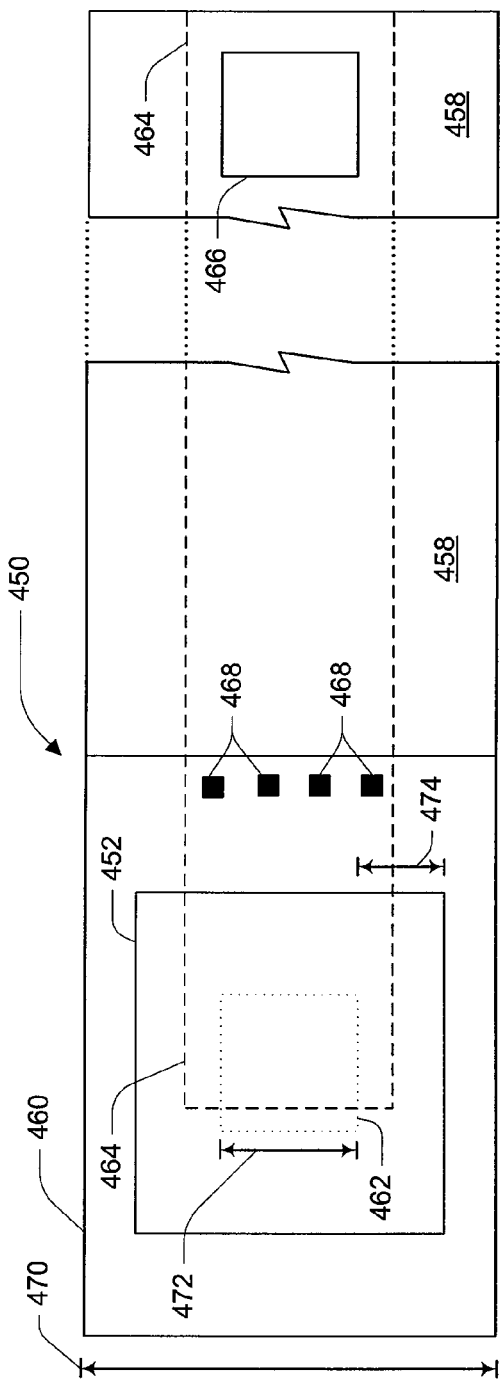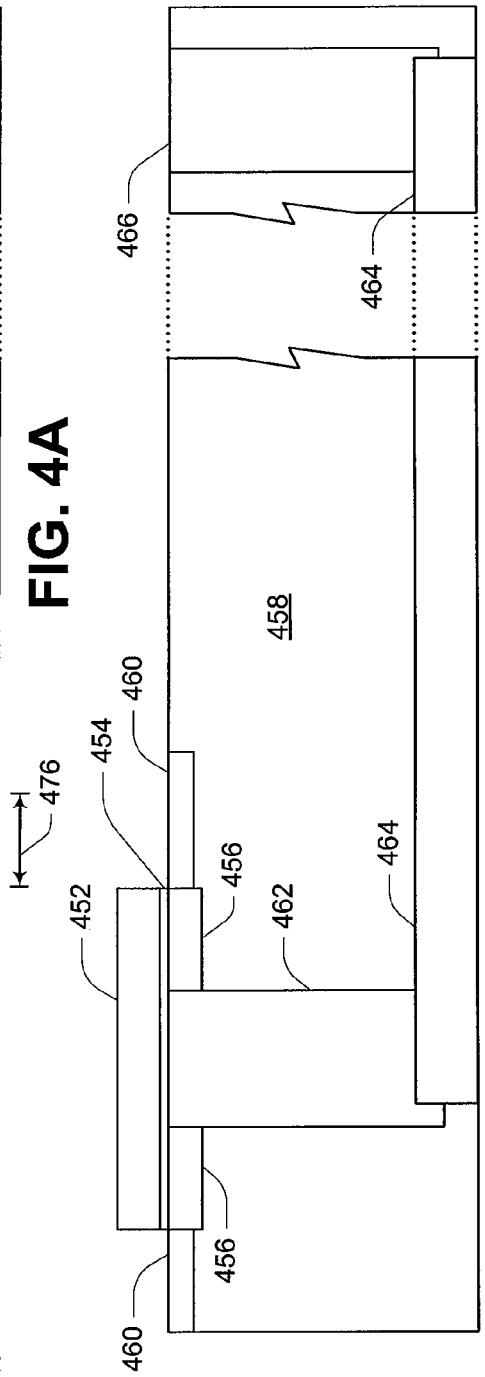

TRANSISTOR HAVING PERIPHERAL CHANNEL

TECHNICAL FIELD

The present disclosure relates generally to integrated circuit devices, and in particular, in one or more embodiments, the present disclosure relates to transistors having peripheral channels and apparatus utilizing such transistors.

BACKGROUND

Integrated circuits are interconnected networks of electrical components fabricated on a common foundation called a substrate. The electrical components are typically fabricated on a wafer of semiconductor material that serves as a substrate. Various fabrication techniques, such as layering, doping, masking, and etching, are used to build millions of resistors, transistors, and other electrical components on the wafer. The components are then interconnected (e.g., wired together) to define a specific electrical circuit, such as a processor or a memory device.

Flash memory devices are one particular class of memory devices that have developed into a popular source of non-volatile memory for a wide range of electronic applications. Non-volatile memory is memory that can retain its data values for some extended period without the application of power. Flash memory devices typically use a one-transistor memory cell that allows for high memory densities, high reliability, and low power consumption. Changes in threshold voltage of the cells, through programming of a charge storage node, such as a floating gate or charge trap, or other physical phenomena, determine the data value of each cell. By defining two or more ranges of threshold voltages to correspond to individual data values, one or more bits of information may be stored on each cell. Common uses for flash memory and other non-volatile memory include personal computers, personal digital assistants (PDAs), digital cameras, digital media players, digital recorders, games, appliances, vehicles, wireless devices, mobile telephones and removable memory modules, and the uses for non-volatile memory continue to expand.

Multi-level memory, e.g., those defining three or more ranges of threshold voltages are increasing in interest. One way to facilitate defining additional ranges of threshold voltages is to increase the usable threshold voltage range of the memory cells. This generally results in a need to use increasing voltage levels on control gates of these memory cells. Traditional field-effect transistors present a challenge to operate effectively in providing these increasing voltage levels.

For the reasons stated above, and for other reasons which will become apparent to those skilled in the art upon reading and understanding the present specification, there is a need in the art for alternative transistor configurations.

BRIEF DESCRIPTION OF THE DRAWINGS

FIGS. 4A-4B are top and side views of a transistor in accordance with an embodiment of the disclosure.

DETAILED DESCRIPTION

In the following detailed description of the present embodiments, reference is made to the accompanying drawings that form a part hereof, and in which is shown by way of illustration specific embodiments in which the embodiments may be practiced. These embodiments are described in sufficient detail to enable those skilled in the art to practice the invention, and it is to be understood that other embodiments may be utilized and that process, electrical or mechanical changes may be made without departing from the scope of the present disclosure. The following detailed description is, therefore, not to be taken in a limiting sense.

Embodiments described herein include transistors for use in semiconductor integrated circuit devices. The transistors include a donut-shaped channel region, such that one source/drain region of the transistor is formed around a perimeter of the channel region, and the other source/drain region is formed to extend through the channel region such that the channel region is formed around a perimeter of an upper portion of the other source/drain region. Such transistors should facilitate a reduction in edge effect and leakage as the channel of the transistor is not bordering on an isolation region. Additionally, the use of a source/drain region extending through the channel region facilitates high-power, high-voltage operation.

Figure 1:
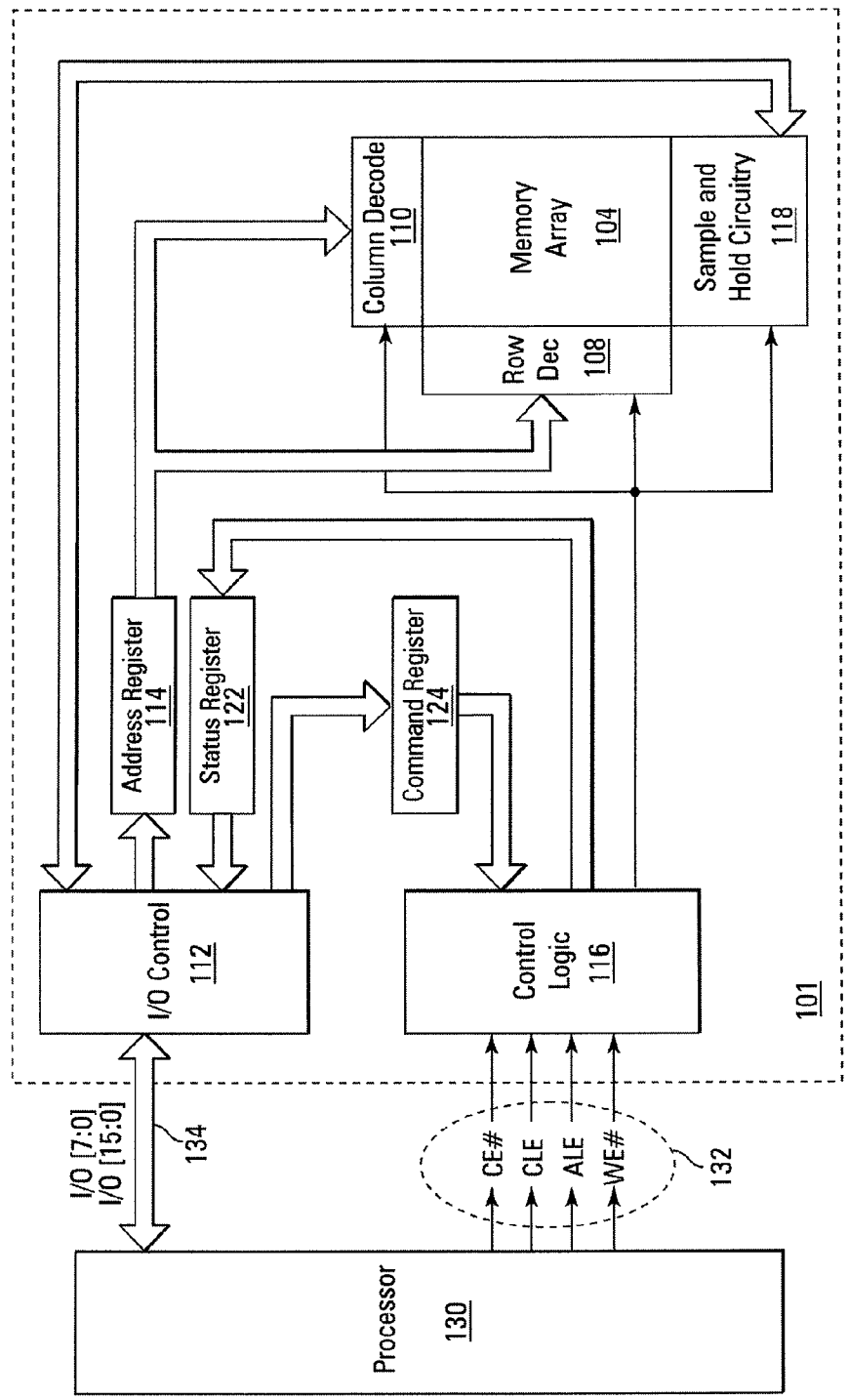
FIG. 1 is a simplified block diagram of a memory device coupled to a processor as part of an electronic system, according to an embodiment of the disclosure.

FIG. 1 is a simplified block diagram of a memory device 100, as one example of an integrated circuit device, in communication with (e.g., coupled to) a processor 130 as part of an electronic system, according to an embodiment of the disclosure. Some examples of electronic systems include personal computers, personal digital assistants (PDAs), digital cameras, digital media players, digital recorders, games, appliances, vehicles, wireless devices, cellular telephones and the like. The processor 130 may be a memory controller or other external processor.

Memory device 100 includes an array of memory cells 104 logically arranged in rows and columns. Although various embodiments will be described primarily with reference to NAND memory arrays, the various embodiments are not limited to a specific architecture of the memory array 104. Some examples of other array architectures suitable for the present embodiments include NOR arrays, AND arrays or other arrays.

A row decode circuitry 108 and a column decode circuitry 110 are provided to decode address signals. Row decode circuitry 108 contains one or more transistors in accordance with embodiments of the disclosure. Address signals are received and decoded to access memory array 104. Memory device 100 also includes input/output (I/O) control circuitry 112 to manage input of commands, addresses and data to the memory device 100 as well as output of data and status information from the memory device 100. An address register 114 is coupled between I/O control circuitry 112 and row decode circuitry 108 and column decode circuitry 110 to latch the address signals prior to decoding. A command register 124 is coupled between I/O control circuitry 112 and control logic 116 to latch incoming commands. Control logic 116 controls access to the memory array 104 in response to the commands and generates status information for the external processor 130. The control logic 116 is coupled to row decode circuitry 108 and column decode circuitry 110 to control the row decode circuitry 108 and column decode circuitry 110 in response to the addresses.

Control logic 116 is also coupled to a cache register 118. Cache register 118 latches data, either incoming or outgoing, as directed by control logic 116 to temporarily store data while the memory array 104 is busy writing or reading, respectively, other data. During a write operation, data is passed from the cache register 118 to data register 120 for transfer to the memory array 104; then new data is latched in the cache register 118 from the I/O control circuitry 112. During a read operation, data is passed from the cache register 118 to the I/O control circuitry 112 for output to the external processor 130; then new data is passed from the data register 120 to the cache register 118. A status register 122 is coupled between I/O control circuitry 112 and control logic 116 to latch the status information for output to the processor 130.

Memory device 100 receives control signals at control logic 116 from processor 130 over a control link 132. The control signals may include a chip enable CE#, a command latch enable CLE, an address latch enable ALE, and a write enable WE#. Memory device 100 receives commands (in the form of command signals), addresses (in the form of address signals), and data (in the form of data signals) from processor 130 over a multiplexed input/output (I/O) bus 134 and outputs data to processor 130 over I/O bus 134.

Specifically, the commands are received over input/output (I/O) pins [7:0] of I/O bus 134 at I/O control circuitry 112 and are written into command register 124. The addresses are received over input/output (I/O) pins [7:0] of bus 134 at I/O control circuitry 112 and are written into address register 114. The data are received over input/output (I/O) pins [7:0] for an 8-bit device or input/output (I/O) pins [15:0] for a 16-bit device at I/O control circuitry 112 and are written into cache register 118. The data are subsequently written into data register 120 for programming memory array 104. For another embodiment, cache register 118 may be omitted, and the data are written directly into data register 120. Data are also output over input/output (I/O) pins [7:0] for an 8-bit device or input/output (I/O) pins [15:0] for a 16-bit device. It will be appreciated by those skilled in the art that additional circuitry and signals can be provided, and that the memory device of FIG. 1 has been simplified to help focus on the present disclosure. Additionally, while the memory device of FIG. 1 has been described in accordance with popular conventions for receipt and output of the various signals, it is noted that the various embodiments are not limited by the specific signals and I/O configurations described unless expressly noted herein.

Figure 2:
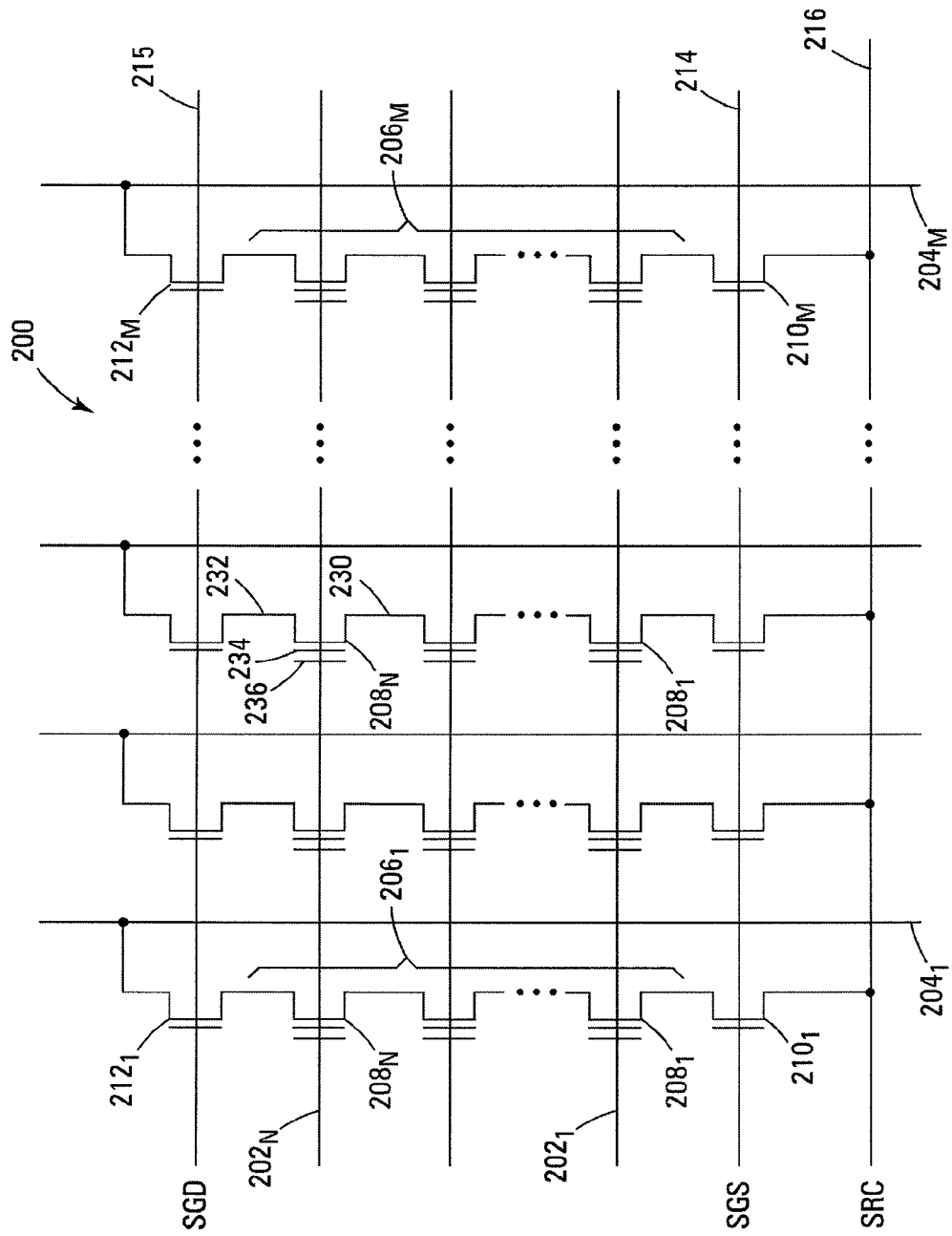
FIG. 2 is a schematic of a portion of an example NAND memory array as might be found in the memory device of FIG. 1.

FIG. 2 is a schematic of a portion of an example NAND memory array 200 as might be found in the memory array 104 of FIG. 1. As shown in FIG. 2, the memory array 200 includes access lines, commonly referred to as word lines (which may comprise commonly coupled control gates $202_1$ to $202_N$) and intersecting data lines, such as bit lines $204_1$ to $204_M$. For ease of addressing in the digital environment, the number of word lines 202 and the number of bit lines 204 are generally each some power of two.

Memory array 200 includes NAND strings $206_1$ to $206_M$. Each NAND string includes transistors $208_1$ to $208_N$, each located at an intersection of a word line 202 and a bit line 204. The transistors 208, depicted as floating-gate transistors in FIG. 2, represent non-volatile memory cells for storage of data. The floating-gate transistors 208 of each NAND string 206 are connected in series source to drain between one or more source select gates 210, e.g., a field-effect transistor (FET), and one or more drain select gates 212, e.g., an FET. Each source select gate 210 is located at an intersection of a local bit line 204 and a source select line 214, while each drain select gate 212 is located at an intersection of a local bit line 204 and a drain select line 215.

A source of each source select gate 210 is connected to a common source line 216. The drain of each source select gate 210 is connected to the source of the first floating-gate transistor 208 of the corresponding NAND string 206. For example, the drain of source select gate $210_1$ is connected to the source of floating-gate transistor $208_1$ of the corresponding NAND string $206_1$. A control gate of each source select gate 210 is connected to source select line 214. If multiple source select gates 210 are utilized for a given NAND string 206, they would be coupled in series between the common source line 216 and the first floating-gate transistor 208 of that NAND string 206.

The drain of each drain select gate 212 is connected to a local bit line 204 for the corresponding NAND string at a drain contact. For example, the drain of drain select gate $212_1$ is connected to the local bit line $204_1$ for the corresponding NAND string $206_1$ at a drain contact. The source of each drain select gate 212 is connected to the drain of the last floating-gate transistor 208 of the corresponding NAND string 206. For example, the source of drain select gate $212_1$ is connected to the drain of floating-gate transistor $208_N$ of the corresponding NAND string $206_1$. If multiple drain select gates 212 are utilized for a given NAND string 206, they would be coupled in series between the corresponding bit line 204 and the last floating-gate transistor $208_N$ of that NAND string 206.

Typical construction of floating-gate transistors 208 includes a source 230 and a drain 232, a floating gate 234, and a control gate 236, as shown in FIG. 2. Floating-gate transistors 208 have their control gates 236 coupled to a word line 202 (e.g., the control gates may be commonly coupled to form a word line). A column of the floating-gate transistors 208 are those NAND strings 206 coupled to a given local bit line 204. A row of the floating-gate transistors 208 are those transistors commonly coupled to a given word line 202. Other forms of transistors 208 may also be utilized with embodiments of the disclosure, such as NROM, magnetic or ferroelectric transistors and other transistors capable of being programmed to assume one of two or more threshold voltage ranges.

Figure 3:
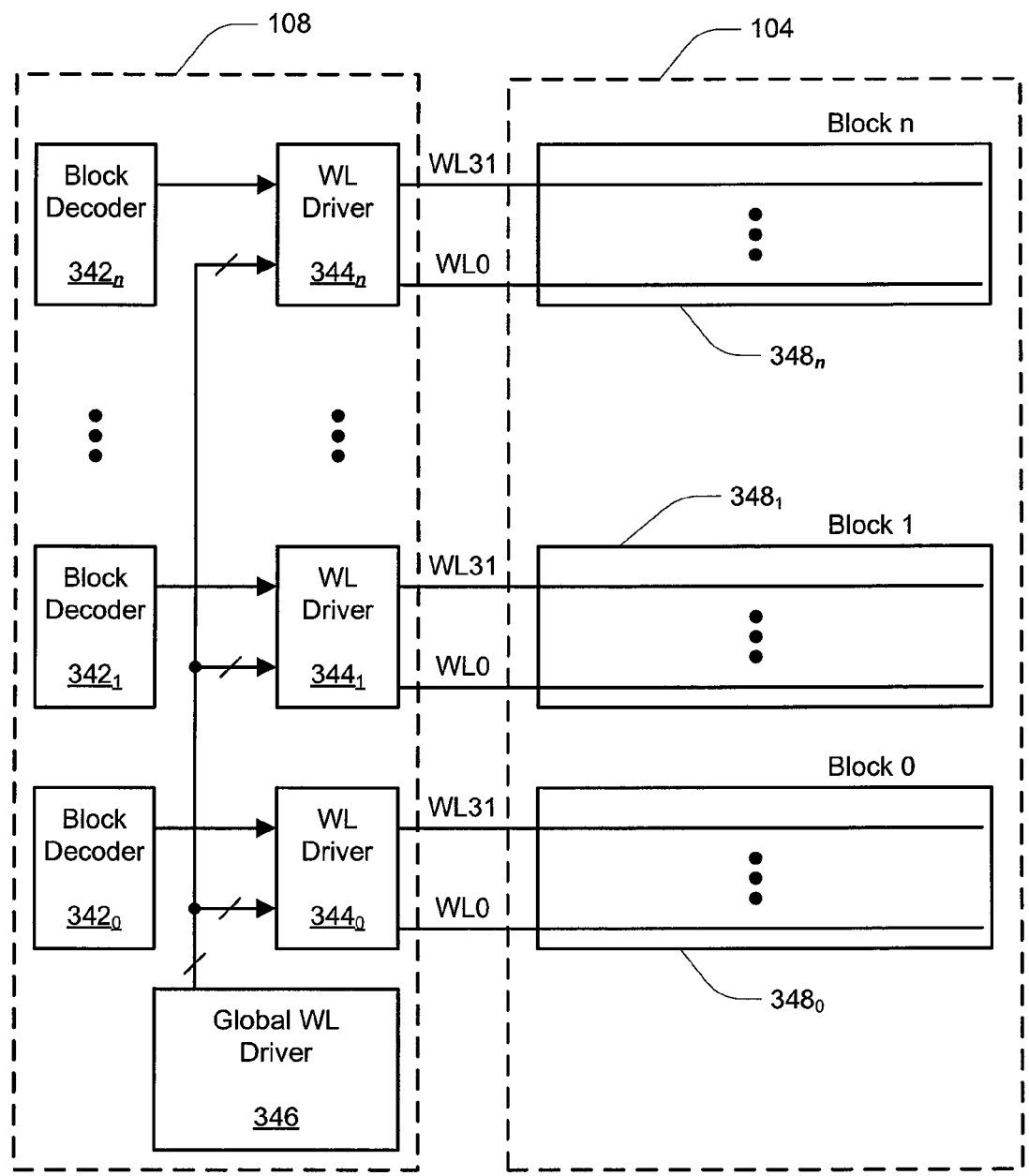
FIG. 3 is a block diagram of additional detail of a row decode circuitry and a memory array as might be found in the memory device of FIG. 1.

FIG. 3 is a block diagram of additional detail of a row decode circuitry 108 and a memory array 104 as might be found in the memory device 100 of FIG. 1. FIG. 3 depicts n+1 blocks of memory cells 348. Referring to a memory array of the type depicted in FIG. 2, a block of memory cells 348 would generally be all of the NAND strings 206 commonly coupled to the same word lines 202. However, other numbers of blocks of memory cells 348 or other groupings of memory cells could be used. FIG. 3 further depicts 32 word lines, i.e., WL0-WL31. Again, other numbers of word lines could be used with various embodiments.

Each of the blocks of memory cells 348 is associated with a word line driver 344 and a block decoder 342. Block decoders 342 are responsive to control signals from the control logic 116 to selectively activate their respective word line drivers 344. Each word line driver 344 is coupled to the word lines of their respective block of memory cells 348. Each word line driver 344 is further coupled to a global word line driver 346. Global word line driver 346 is adapted to supply the potentials for driving the word lines of the block of memory cells 348 through its respective word line driver 344 that has been activated by its respective block decoder 342. The word line drivers 344 contain transistors (not shown in FIG. 3) in accordance with embodiments of the disclosure, with their gates coupled to a block decoder 342, a source/drain region coupled to the global word line driver 346 and another source/drain region coupled to a word line of a block of memory cells 348.

FIGS. 4A-4B are top and side views of a transistor 450 in accordance with an embodiment of the disclosure. Transistor 450 includes a control gate 452, and a gate dielectric 454 formed between a semiconductor material 458 and the control gate 452. The control gate 452 is coupled to receive a control signal from a block decoder (not shown in FIGS. 4A-4B).

The semiconductor material 458 is a semiconductor material or materials of a first conductivity type, such as a p-type monocrystalline silicon substrate, for example. The control gate 452 is a conductor and may include one or more layers of conductive material. For example, the control gate 452 may include conductively-doped polysilicon, metals, metal silicides and other conductive materials. The gate dielectric 454 is a dielectric material. For example, the gate dielectric 454 may include thermally-grown silicon dioxide ($SiO_2$) on a silicon semiconductor material 458. The gate dielectric 454 may further include dielectrics of higher K values, such as hafnium oxide ($HfO_2$), zirconium oxide ($ZrO_2$), aluminum oxide ($Al_2O_3$), aluminum hafnium oxide (AlHfOx), etc.

The transistor 450 further includes a channel region 456 formed in the semiconductor material 458 below the gate dielectric 454. The channel region 456 has the first conductivity type and may include doping of the semiconductor material 458 to increase its conductivity. For example, if the semiconductor material 458 is a p-type monocrystalline silicon, the channel region 456 could include increasing the p-type conductivity through doping using boron (B) or another p-type impurity.

The transistor 450 further includes a source/drain region 462 formed in the semiconductor material 458 and passing through the channel region 456, such that the channel region 456 is formed around a perimeter of the source/drain region 462. The source/drain region 462 has a conductivity type different than the first conductivity type, i.e., a second conductivity type. For one embodiment, the second conductivity type is an opposite conductivity type from the first conductivity type. For example, if the semiconductor material 458 is a p-type monocrystalline silicon, the source/drain region 462 could include an n-type region formed in the semiconductor material 458, such as by doping with antimony (Sb), arsenic (As), phosphorus (P) or another n-type impurity. The source/drain region 462 is coupled to a well region 464. The well region 464 has the second conductivity type and is formed in the semiconductor material 458 below a level of the channel region 456. Formation of the well region 464 could include a deep implant of n-type impurities, in this example. The well region 464 is coupled to a contact 466 that is coupled to receive a potential from a global word line driver (not shown in FIGS. 4A-4B). Contact 466 may be include a conductive region having the second conductivity type. Contact 466 is laterally spaced apart from the source/drain region 462 and extends into the semiconductor material 458 to at least a level of the well region 464, thereby coupling the contact 466 to the source/drain region 462 through the well region 464. By coupling a global word line driver such as global word line driver 346, to one or more local word line drivers such as word line drivers 344, using a well region such as well region 464, metal levels running tangentially to the word lines may be reduced or eliminated compared to devices relying on interconnects formed above a surface of the semiconductor material 458.

The transistor 450 further includes a source/drain region 460 formed in the semiconductor material 458 around a perimeter of the channel region 456. The source/drain region 460 has the second conductivity type. One or more contacts 468 are coupled to the source/drain region 460 and to a word line (not shown in FIGS. 4A-4B). In this manner, activation of the transistor 450 couples a potential from a global word line driver to its associated word line.

Example dimensions of transistor 450 within the capabilities of common fabrication techniques currently employed include a width 472 of the source/drain region 462 of less than or equal to 1 µm. For a further example, a width 470 of the source/drain region 460 might be less than or equal to 2 µm, while a distance 474 between a perimeter of the source/drain region 462 and a perimeter of the channel region 456 might be less than or equal to 0.5 µm. A distance 476 between a perimeter of the channel region 456 and the word line contacts 468 might be less than 0.5 µm. While the transistor 450 is depicted to contain substantially square features, one or more of the control gate 452, the gate dielectric 454, the source/drain region 460, the channel region 456 and the source/drain region 462 may include circular features or some other geometric shape. Each would be deemed a donut-shaped channel region 456, as that term is used herein, as there would be a hole in the interior of the channel region 456, and the channel region 456 would have an interior periphery adjacent source/drain region 462 and an exterior periphery adjacent source/drain region 460.

One example of operation of the transistor 450 will be described with reference to FIGS. 1, 3 and 4A-4B. For this example, selection and activation of the block of memory cells $348_1$ is assumed. Block decoder $342_1$ receives a control signal from the control logic 116 indicative of a desire to select the block of memory cells $348_1$. In response, block decoder $342_1$ applies a potential to the control gate 452 of the transistor 450 sufficient to activate the transistor 450. Concurrently, the global word line driver 346 receives a control signal from the control logic 116 indicative of a desire to supply word line potentials to the memory array 104. In response, the global word line driver 346 applies a particular potential to the well region 464 and thus to the source/drain region 462. In general, different word line potentials are applied to different word lines of a block of memory cells 348, depending upon their relationship to a target word line, although the disclosure is not limited by any particular word line potentials. With the transistor 450 activated, the transistor 450 couples its associated word line to the potential applied to its source/drain region 462, thereby driving that word line.

Although specific embodiments have been illustrated and described herein, it will be appreciated by those of ordinary skill in the art that any arrangement that is calculated to achieve the same purpose may be substituted for the specific embodiments shown. For example, transistors in accordance with embodiments of the disclosure may find other applications, such as in an output stage of the global word line driver. Many adaptations of the disclosure will be apparent to those of ordinary skill in the art. Accordingly, this application is intended to cover any adaptations or variations of the disclosure.

What is claimed is:

1. A transistor, comprising:
   a control gate;
   a gate dielectric formed between the control gate and a semiconductor material;
   a channel region formed in the semiconductor material below the gate dielectric;
   a first source/drain region formed in the semiconductor material around a perimeter of the channel region;
   a second source/drain region extending below the gate dielectric and through the channel region, such that the channel region is formed around a perimeter of the second source/drain region.

2. The transistor of claim 1, wherein the semiconductor material has a first conductivity type, the channel region has the first conductivity type, the first source/drain region has a second conductivity type and the second source/drain region has the second conductivity type.

3. The transistor of claim 2, wherein the first conductivity type is a p-type conductivity and the second conductivity type is an n-type conductivity.

4. The transistor of claim 2, wherein the channel region is doped to increase its conductivity.

5. The transistor of claim 1, wherein the semiconductor material is a silicon substrate.

6. The transistor of claim 1, wherein a distance between the perimeter of the second source/drain region and the perimeter of the channel region is less than or equal to 0.5 µm.

7. The transistor of claim 1, wherein a width of the second source/drain region is less than or equal to 1 µm.

8. The transistor of claim 1, wherein a width of the first source/drain region is less than or equal to 2 µm.

9. The transistor of claim 1, wherein features of the control gate, gate dielectric, channel region, first source/drain region and second source/drain region are square.

10. The transistor of claim 1, further comprising:
one or more contacts coupled to the first source/drain region;
wherein the one or more contacts are further coupled to an access line of an array of memory cells.

11. The transistor of claim 10, further comprising:
a well region formed at a level below the channel region and coupled to a bottom portion of the second source/drain region and having a same conductivity type as a conductivity type of the second source/drain region.

12. The transistor of claim 11, wherein the semiconductor material has a first conductivity type, the second source/drain region has a second conductivity type and the well region has the second conductivity type.

13. The transistor of claim 11, wherein the well region is coupled to receive a potential to be applied to the access line.

14. The transistor of claim 13, wherein the control gate is coupled to receive a control signal to selectively couple the potential to the access line.

15. A memory device, comprising:
an array of memory cells logically arranged in rows and columns, with access lines coupled to control gates of the memory cells;
control logic for controlling access to the array of memory cells; and
a row decode circuitry for selectively driving access lines, wherein the row decode circuitry comprises at least one transistor having a first source/drain region coupled to an access line, a control gate coupled to receive a control signal, and a second source/drain region coupled to receive a potential to be applied to the access line, the transistor comprising:
a gate dielectric formed between the control gate and a semiconductor substrate; and
a channel region formed in the semiconductor material below the gate dielectric;
wherein the first source/drain region is formed in the semiconductor material around a perimeter of the channel region; and
wherein the second source/drain region extends below the gate dielectric and through the channel region, such that the channel region is formed around a perimeter of the second source/drain region.

16. The memory device of claim 15, wherein the semiconductor material has a first conductivity type, the channel region has the first conductivity type, the first source/drain region has a conductivity type opposite the first conductivity type and the second source/drain region has the conductivity type opposite the first conductivity type.

17. The memory device of claim 15, wherein the channel region is donut-shaped.

18. The memory device of claim 15, further comprising:
a well region formed at a level below the channel region and coupled to a bottom portion of the second source/drain region and having a same conductivity type as a conductivity type of the second source/drain region; and
a contact laterally spaced apart from the second source/drain region and extending into the semiconductor material to at least a level of the well region;
wherein the contact is coupled to receive the potential to be applied to the access line.

19. The memory device of claim 15, wherein features of the control gate, gate dielectric, channel region, first source/drain region and second source/drain region are circular.

20. The memory device of claim 15, further comprising:
one or more contacts coupled to the first source/drain region;
wherein the one or more contacts are further coupled to an access line.

21. A memory device, comprising:
an array of memory cells logically arranged in rows and columns, with access lines coupled to control gates of the memory cells;
control logic for controlling access to the array of memory cells; and
a row decode circuitry for selectively driving access lines, wherein the row decode circuitry comprises at least one transistor having a first source/drain region coupled to an access line, a control gate coupled to receive a control signal, and a second source/drain region coupled to receive a potential to be applied to the access line, the transistor comprising:
a gate dielectric formed between the control gate and a semiconductor substrate;
a channel region formed in the semiconductor material below the gate dielectric;
a well region formed at a level below the channel region and coupled to a bottom portion of the second source/drain region and having a same conductivity type as a conductivity type of the second source/drain region; and
one or more contacts coupled to the first source/drain region;
wherein the one or more contacts are further coupled to an access line;
wherein the first source/drain region is formed in the semiconductor material around a perimeter of the channel region; and
wherein the second source/drain region extends below the gate dielectric and through the channel region, such that the channel region is formed around a perimeter of the second source/drain region.

22. The memory device of claim 21, wherein the semiconductor material has a first conductivity type, the second source/drain region has a conductivity type opposite the first conductivity type and the well region has the conductivity type opposite the first conductivity type.

23. The memory device of claim 21, wherein the well region is coupled to receive the potential to be applied to the access line.

* * * * *